United States Patent
Dillard

[19]

[11] Patent Number: 5,928,437
[45] Date of Patent: Jul. 27, 1999

[54] MICROARRAY FOR EFFICIENT ENERGY GENERATION FOR SATELLITES

[75] Inventor: Paul A. Dillard, Kent, Wash.

[73] Assignee: The Boeing Company, Seattle, Wash.

[21] Appl. No.: 08/747,184

[22] Filed: Nov. 12, 1996

Related U.S. Application Data

[63] Continuation-in-part of application No. 08/386,529, Feb. 9, 1995, abandoned.

[51] Int. Cl.[6] .................................................... H01L 25/00
[52] U.S. Cl. ......................... 136/244; 136/249; 136/292; 438/57; 438/66
[58] Field of Search ................... 136/244, 249, 136/292; 438/57, 66

[56] References Cited

U.S. PATENT DOCUMENTS

| | | | |
|---|---|---|---|
| 3,151,379 | 10/1964 | Escoffery | 437/4 |
| 4,199,377 | 4/1980 | Corwin et al. | 136/255 |
| 4,322,571 | 3/1982 | Stanbery | 136/255 |
| 4,392,451 | 7/1983 | Mickelsen et al. | 118/690 |
| 4,523,051 | 6/1985 | Mickelsen et al. | 136/260 |
| 4,680,422 | 7/1987 | Stanbery | 136/249 |
| 4,684,761 | 8/1987 | Devaney | 136/258 |
| 4,703,131 | 10/1987 | Dursch | 136/258 |
| 4,795,501 | 1/1989 | Stanbery | 136/249 |
| 4,867,801 | 9/1989 | Stanbery | 136/249 |
| 5,021,099 | 6/1991 | Kim et al. | 136/249 |
| 5,078,804 | 1/1992 | Chen et al. | 136/260 |
| 5,091,018 | 2/1992 | Fraas et al. | 136/246 |
| 5,096,505 | 3/1992 | Fraas et al. | 136/246 |
| 5,102,471 | 4/1992 | Sasaki | 136/244 |
| 5,118,361 | 6/1992 | Fraas et al. | 136/246 |
| 5,123,968 | 6/1992 | Fraas et al. | 136/246 |
| 5,128,736 | 7/1992 | Yoshida et al. | 257/258 |
| 5,141,564 | 8/1992 | Chen et al. | 136/258 |
| 5,217,539 | 6/1993 | Fraas et al. | 136/246 |
| 5,248,346 | 9/1993 | Fraas et al. | 136/244 |
| 5,261,969 | 11/1993 | Stanbery | 136/249 |
| 5,391,236 | 2/1995 | Krut et al. | 136/249 |
| 5,478,407 | 12/1995 | Dorison et al. | 136/244 |
| 5,716,459 | 2/1998 | Chang et al. | 136/249 |

*Primary Examiner*—Mark Chapman
*Attorney, Agent, or Firm*—John C. Hammar

[57] ABSTRACT

A microarray uses small, irregularly shaped, or nonplanar surfaces on a satellite to maximize power generation without introducing a significant weight penalty. The microarray includes a plurality of individual solar cells normally provided by dicing a conventional solar cell junction into the smaller solar cells. Microarray design involves using the available area for supporting the microarray, the voltage contribution from the individual solar cells, the voltage requirement of the microarray to determine the number of smaller solar cells that are necessary and their size.

7 Claims, 6 Drawing Sheets

MICROARRAY FOR EFFICIENT ENERGY GENERATION FOR SATELLITES

REFERENCE TO RELATED APPLICATION

The present application is a continuation-in-part application based upon U.S. patent application Ser. No. 08/386,529, filed Feb. 9, 1995 now abandoned, which I incorporate by reference.

TECHNICAL FIELD

The present invention relates to solar cell arrays and methods for optimizing their utility for generating electrical energy on satellites. Microarrays use small, irregularly shaped, or nonplanar surfaces on satellites to capture solar energy efficiently, allowing smaller spacecraft configurations with optimally tailored power.

BACKGROUND OF THE INVENTION

Performance of conventional solar cell panels depends upon the size, shape, flexibility, and packing efficiency of the individual solar cells that are assembled to make up the panels. These relatively large (1–9 $in^2$) size of the solar cells and arrays affect the performance of the cells and complicate their mounting on small, irregularly shaped, or nonplanar body surfaces. For optimal array performance, every cell in an array should be receiving substantially the same illumination. The efficiency of the cells falls dramatically as the angle of incident radiation deviates from being normal (90°) to the surface. Yet, to cover the exterior of a satellite requires that the cells curve around in discrete segments or facets being some multiple of the characteristic dimension of an individual cell. To generate the desired spacecraft power, multiple cells must be interconnected. A cell's voltage is a function of the material while its current relates to the efficiency of illumination. If the curvature of the array (or offset from normality with the incident radiation) exceeds about 15° of arc around the exterior surface of the satellite, the differences in illumination will be so significant. The array will generate for all the interconnected cells at the performance of the weakest cell. The total power generated will be a fraction of what could be generated if the array and subcircuit designs achieved substantially equal illumination for all the cells in a given zone of intensity.

Amorphous silicon solar panels have been made on flexible substrates, and could be made into irregular shapes; however, amorphous silicon degrades in sunlight. These flexible cells could conform with the spacecraft's surface, but the low conversion efficiency (8–10%) and the degradation make them undesirable.

Power is a function of the cell's conversion efficiency, its characteristic voltage, its generated current, and area. To achieve the desired subcircuit voltage for a useful space power subsystem, a predetermined number of solar cells are connected electrically in series. Each cell contributes an increment to the array voltage. The voltage each cell produces depends on the material from which the cell is made and the operating conditions, primarily the temperature. For example, silicon cells generate about 0.5 volts while gallium arsenide (GaAs) cells generate about 0.9 volts at room temperature. A subcircuit designed to produce 36 volts (a common spacecraft power system voltage) requires 72 silicon cells or 45 GaAs cells. The total area is 72 times the individual silicon cell area (or 45 times for GaAs cells) divided by the packing factor (usually approximately 0.9). Therefore, a subcircuit made up of common 2×2 cm (i.e., 1 $in^2$) silicon cells would have a total area of about 320 $cm^2$ (about 200 $cm^2$ for the GaAs cells). Areas of substantially equal illumination this large are often unavailable on the exterior surfaces of satellites, so the satellites need to carry a complicated folding solar power panel and a tracking system to point the panel at the sun. Smaller surface areas on the satellite are essentially wasted because covering the smaller areas with conventional solar cells does not produce power at the desired 36 volts or the illumination of interconnected yet dispersed cells may be so different that the array generates virtually no power, corresponding to 72 or 45 times the weakest cell.

All cells within a given subcircuit in an array must be identical in area, perform at the same efficiency, and receive the same solar fluence (i.e., be illuminated equally) to generate the same amount of electrical current. If the current from cells in an array is not matched, the output of the subcircuit will be reduced. Either the current in the subcircuit will be reduced to that of the weakest cell, or the weak cell will be forced to operate in reverse causing resistive heating and a subsequent reduction in total subcircuit voltage.

Nonuniform illumination of the cells can result from a shadow cast across any cell within a subcircuit or from curvature of the array. Nonuniform illumination causes some cells to operate at reduced current and voltage. When large area subcircuits experience nonuniform illumination, the area effectively removed from power production can be much greater than the actual area that is in the shadow. The current from the entire subcircuit is reduced to the current produced by the least illuminated (i.e. the weakest) cell.

A need exists for low-cost, self-contained photovoltaic power subsystems for use on microsatellites that take advantage of small, irregularly shaped, or nonplanar surfaces to capture solar energy. Such systems should be adaptable to non-rectangular and nonplanar surfaces and be sized so that, when shadows fall on the cells, only the actual shadowed area is removed from power production. In addition, the system should lend itself to processing steps that are reliable and economic. Microelectronic processing techniques, like photolithography, allow the manufacture of small cells of equal area of regular or irregular shape. Small cells allow the construction of microarrays. For example, if a 2×2 cm silicon solar cell were partitioned into 72 active areas connected in series, the 2×2 area would produce 36 volts yet the array would be tiny with respect to conventional designs. Each cell would be about 0.1×0.1 inch (0.25×0.25 cm). The present invention involves design and fabrication of microarrays using these tiny cells. Microarrays occupy small areas and enable smaller spacecraft with reduced mass and with optimally tailored power. Microarrays can be made with any planar solar cell phototransducer, such as crystalline Si, GaAs, GaInP/GaAs, or α-Si. Because the cells in a microarray occupy a smaller total area, it is easier to arrange the cells on the satellite's exterior so that they are equally illuminated.

SUMMARY OF THE INVENTION

The present invention is a microarray for collecting solar energy on a satellite body surface that is limited in size, irregularly shaped, or nonplanar. The microarray has a plurality of miniature solar cells having substantially equal surface area to produce an output voltage matched with other conventional power subsystem components of the satellite. The output voltage of a phototransducer (i.e. solar cell) is independent of its size. The current and power are related to cell size. Output voltage from an array is the sum of the voltages of the individual cells that are connected in series. A microarray formed in accordance with the present invention can be mounted on nonplanar surfaces, is tolerant to shadow, and minimizes design oversizing. The microarrays have a high specific voltage (i.e. voltage/unit mass).

The simplest microarray is formed from a single conventional solar cell, usually the largest area standard wafer processed by the manufacturer. This wafer is subdivided into subcells that are interconnected to provide the combined voltage of a conventional array. The main advantage of the microarray is the capability to tailor the operating voltage to optimize and match with other subsystem components in a design that arranges the subcells to provide substantially uniform illumination. It can be mounted on curved surfaces, and other available mounting surfaces to increase power/area and utilize otherwise wasted area.

Performance analysis determines the expected operating conditions for cells on the area on the body of the spacecraft available for array mounting, then, uses the expected output voltage of each solar cell to determine the number of series-connected solar cells that are required to provide the desired voltage for the satellite's power system. Using that number of cells, the area and curvature of the support surface, and the packing efficiency, I determine the subcell size, shape and interconnections required. I divide the conventional cell into a number of subcells having the predetermined, substantially equal surface areas. I electrically connect the smaller solar cells together in series to provide the solar cell microarray. Interconnects can allow for flexure between individual cells during fabrication, installation, temperature cycling, and service.

The smaller cells can be the same shape or can be different shape provided that all cells in the same array have the same area. The shape might be rectangular or any other shape. A single substrate the size of the total area available for power collection can be segmented into active areas and electrically insulating areas using photolithography and appropriate dopants to establish the active areas. Interconnects can be fabricated in the insulating areas to collect power and to allow array installation with access only to one side. Therefore, the present invention is the analog of integrated circuits or miniaturization applied to form solar panel circuits out of solar cells.

BRIEF DESCRIPTION OF THE DRAWINGS

FIG. 6 is a magnified perspective view of a portion of a microarray of the present invention having mechanical interconnects. FIG. 6 lacks a front interconnect.

DETAILED DESCRIPTION OF THE PREFERRED EMBODIMENT

A microarray covers small, irregularly shaped, or nonplanar surfaces on satellites to capture solar energy efficiently with minimal mass, thereby providing relatively high specific power (total spacecraft power per total spacecraft mass). The surfaces used to support the microarray usually are small in size, irregular in shape, or nonplanar. Until the microarray, these areas had little or no use. The areas preferably are oriented along lines of constant solar illumination around the satellite exterior. That is, the areas have a characteristic axis corresponding to the axis of constant illumination like a line of longitude on a globe.

Figure 1:
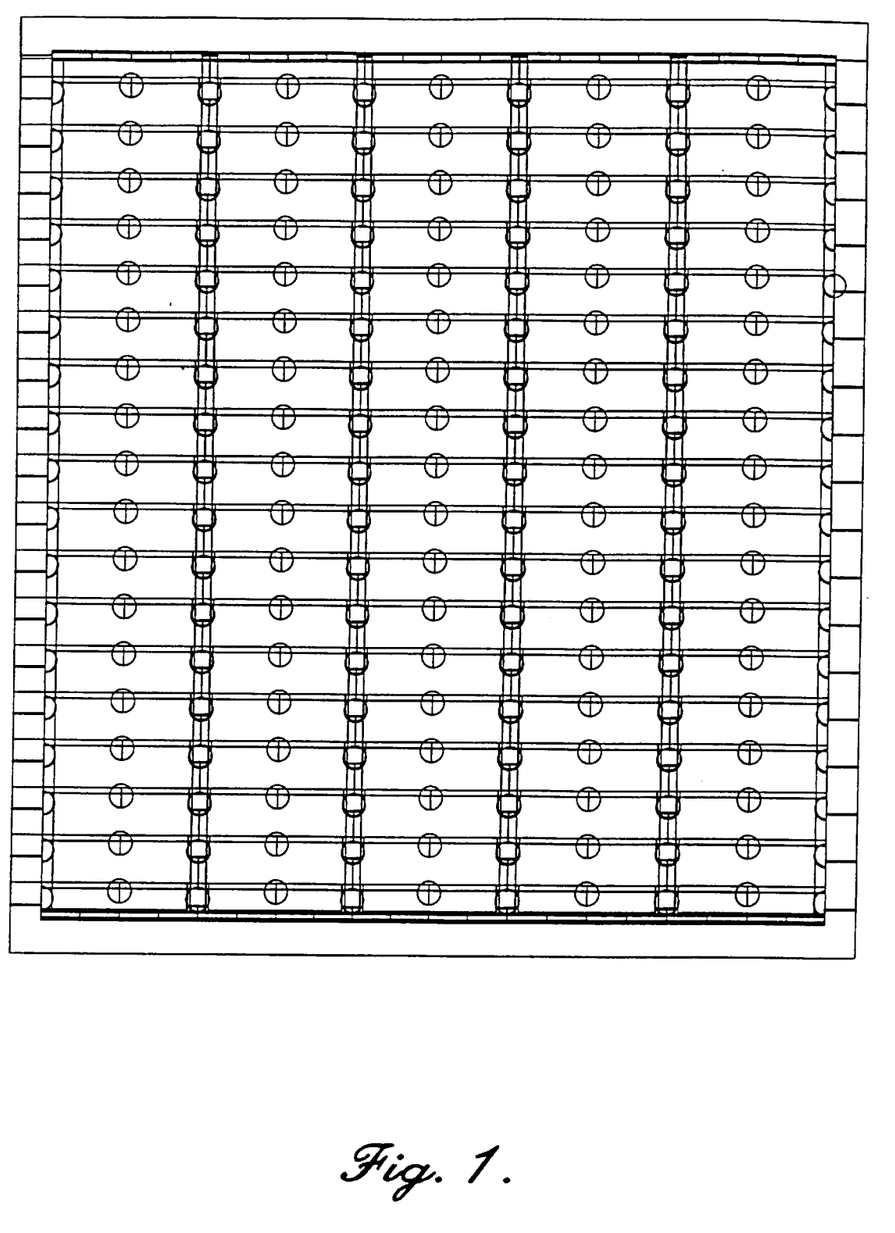
FIG. 1 is a plan view of an assembled solar cell microarray of the present invention.

A rectangular microarray 98 includes a rear interconnect 100, an optional substrate 102, an array of small solar cells interconnected in series 104 and a front interconnect 106. Although not illustrated, the microarray may also include a radiation transparent coverglass attached to the front interconnect with a solar transparent adhesive having an index of refraction that matches the cell and coverglass to reduce reflection losses. The microarray can also include a transparent or opaque rear cover sheet. Preferably, if the solar cell microarray is to be used in a tandem cell configuration, the rear cover sheet should maximize transmission of infrared (IR) solar energy in the wavelengths between the response cutoff of the front cell and the response cutoff of the rear cell.

Figures 3, 5:
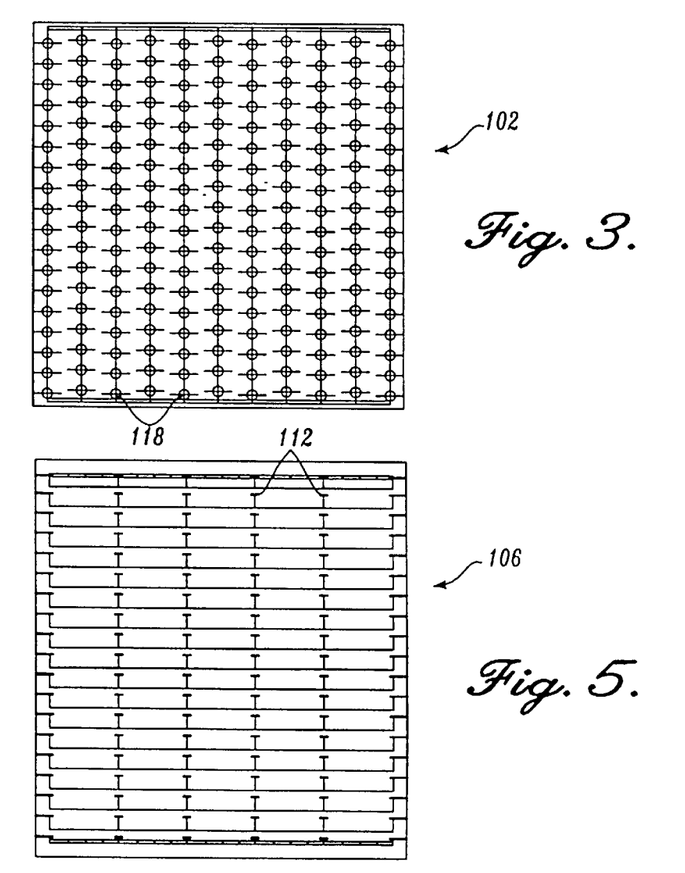
FIG. 3 is a plan view of an optional support substrate for the microarray of FIG. 1.
FIG. 5 is a plan view of a top interconnect of the microarray of FIG. 1.
Figure 4:
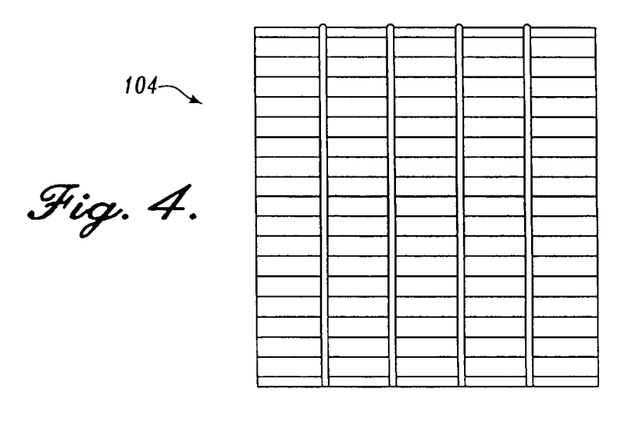
FIG. 4 is a plan view of a diced solar cell junction of the microarray of FIG. 1.

A substrate 102 is generally used to provide structural support to the microarray during manufacture. The specific power (i.e., watts/kg) will be maximized, however, if the substrate is omitted. Suitable materials for the substrate include fiber-reinforced polyimide, thin fiberglass board, and microsheet glass, or the like.

Figure 2:
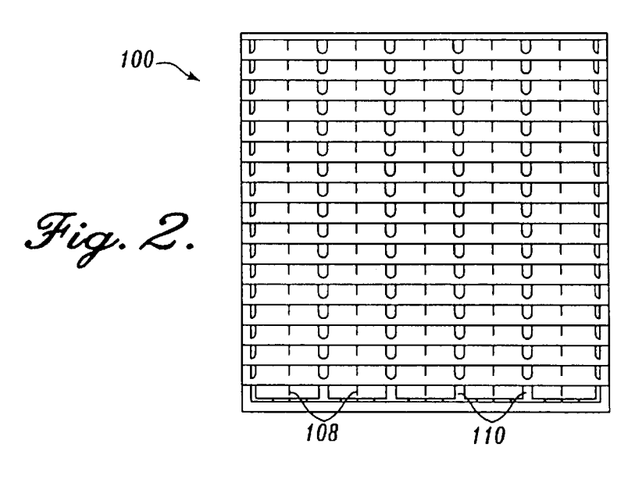
FIG. 2 is a plan view of a typical rear interconnect of the microarray of FIG. 1.

The rear and front interconnects 100 and 106 provide series and parallel electrical connection between the individual solar cells that make up the microarray. The interconnects can be made from conventional materials such as copper, silver, silver-plated nickel iron alloy such as KOVAR, or silver-plated molybdenum. The interconnects are applied using conventional soldering or welding techniques such as vapor phase reflow, wire bonding, and parallel gap welding, or using vapor deposition through photolithographic masks. FIGS. 2 and 5 illustrate examples of preferred front and rear mechanical interconnects; however, other configurations (such as a single interconnect to provide series parallel bonds to single-sided contacts on the solar cell) would be suitable depending upon the particular configuration of the microarray. Both the rear interconnect 100 and front interconnect 106 include redundant electrical connections for the parallel and series connections so that the microarray has higher assurance of operability when launched. The interconnect redundancy introduces only a small weight penalty. Redundancy protects performance in the case of loss of a single bond joint for any or all of the individual solar cells.

Each solar cell 104 can be any suitable material including silicon, gallium arsenide on germanium (GaAs/Ge(i)), gallium arsenide on gallium arsenide (GaAs/GaAs), or gallium indium phosphide on gallium arsenide/germanium (GaInP/GaAs/Ge). Suitable solar cells are readily available from a number of manufacturers, such as Applied Solar Energy, Spectrolab, Sunpower, Siemens, Solarex, or Sharp. I prefer single crystal materials having high conversion efficiencies.

The design and assembly of a solar cell microarray begins with the step of determining the area available to support the microarray. The chosen surface may be small in size, irregular in shape (non-rectangular), or nonplanar. Nonplanar surfaces of interest include conical or cylindrical surfaces on the curved body sides of common cylindrical or spherical satellites. Areas having substantially constant illumination are the best candidates.

Factors to consider in covering a surface with a microarray include the degree of shadowing the surface will encounter, the angle of solar incidence, the time and duration of illumination of the surface, and the resulting surface temperature. Preferably, the area chosen will not encounter shadowing during power generation intervals and will maintain an optimum position relative to the incident solar energy or at least exhibit a minimum amount of divergence from the optimum angle of incidence relative to the source of solar energy. The area and shape of the surface available to support the microarray will naturally define the overall size and shape for the microarray. The microarray is configured to supply the required total voltage. The total voltage from the microarray matches the voltage of the satellite subsystems to which the microarray will be electrically connected. A typical solar array supply voltage for an electrical subsystem on a satellite is 36 volts. The operating voltage of the solar cell microarray is determined by the bus and/or load voltage required. Typically, the array components are diode isolated from the load bus. Although the microarray has cells of smaller area and therefore produces smaller current, the microarrays are designed to operate at the same voltage as the other satellite systems and are connected in parallel with these systems.

To match the voltage of the satellite's electrical subsystem the individual solar cells making up the microarray must be substantially equal in area, perform at the same efficiency, and receive the same solar fluence to generate the same amount of current. If the currents generated by individual solar cells within a microarray differ, the power output of the microarray will be reduced just as would occur in a traditional array. Either the current will be reduced to that of the weakest cell or the weak cell will be forced to operate in reverse causing undesirable resistive heating and reducing subcircuit voltage. If the surface available to support the solar cell microarray is irregular, e.g., rhombic or triangular, the shape of the individual solar cells making up the microarray will not necessarily be identical, but they must be equal area. For example, one cell might be a square 0.2×0.2 cm while a second cell being a rectangle of 0.1×0.4 cm or a third cell a triangle having a height of 0.2 cm and a base of 0.4 cm.

Areas are provided for electrical interconnects and other non-power generating structural elements. These areas must be subtracted from the surface area available for power production. The surface area of the individual solar cells making up the microarray is determined by dividing the area available for power production by the number of individual solar cells required. The packing efficiency adjusts for flexure during mounting to curved surfaces and the number of solar cells making up the microarray. Typical packing efficiencies range from about 85% to about 95%.

The dividing of a single solar cell junction into a number of smaller solar cells can be completed either after attachment of the optional substrate or after a rear interconnect has been attached to the rear of a single solar cell junction. The rear interconnect can be connected to the rear of the single solar cell junction by conventional techniques such as soldering to the grid lines and contact pads on the rear of the solar cell junction. One example of a rear interconnect is illustrated in FIG. 2. Rear interconnect 100 includes small fingers 108 for soldering to the grid lines on the rear of the solar cell junction. Rear interconnect 100 also includes rear interconnect pads 110 designed to provide a bonding site to front interconnect pads 112. The soldering of front interconnect pads 112 to rear interconnect pads 110 provides a series of electrical interconnections between individual solar cells making up the microarray 98.

All the cells of the microarray can be supported on a flexible substrate using an adhesive which may be glass filled. When the flexible substrate is used, it can be sandwiched between the solar cell junction and the rear interconnect. This configuration is best illustrated in FIGS. 6 and 7 where an adhesive 114 is interposed between a solar cell 104 and the flexible substrate 116.

Optional substrate 102 illustrated in FIG. 3 includes a plurality of throughholes 118 positioned such that, when substrate 102, rear interconnect 100, and solar cell junction 104 are assembled, the holes align with rear interconnect pads 110 and provide a passage for front interconnects 112 to pass through and be soldered to rear interconnect pads 110.

Figure 6:
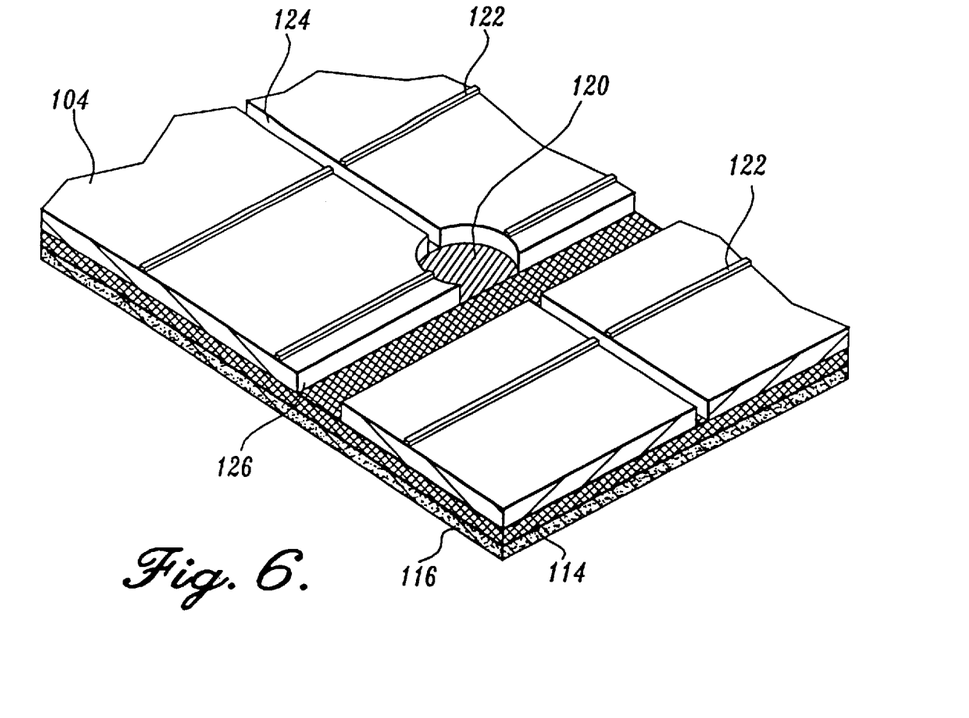
Figure 7:
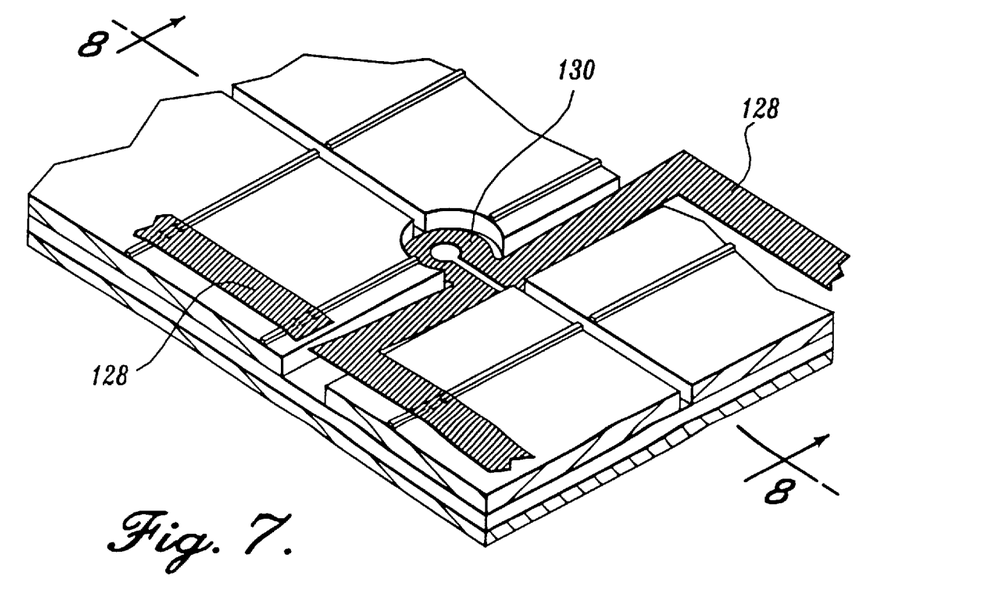
FIG. 7 is another magnified perspective view of a microarray, similar to FIG. 6, showing a front interconnect.

Referring to FIG. 6, dividing of the solar cell junction into the smaller individual solar cells to make the microarray can be carried out after the rear interconnect 120 is attached. This division of the larger solar cell junction into the smaller individual solar cells (dicing) can be accomplished by known mechanical techniques, including diamond sawing, laser scribing, or chemical etching. This dicing physically cuts through the solar cell junction 104 completely as well as through the front grid lines 122 and rear grid lines (not shown) of the solar cell junction. The dicing should not cut through the rear interconnect grid. By dividing the larger solar cell junction in this manner, the individual smaller solar cells that result are electrically isolated from each other until such time that the front and rear interconnects are electrically connected. During dicing of the larger solar cell junction, the rear interconnect (or alternatively, the optional substrate) holds the individual cell junctions in precise geometric relationship so that the interconnect features are bonded properly during subsequent operations.

Dicing of the larger solar cell junction into the smaller solar cells also increases the flexibility of the larger solar cell junction in the direction of the dicing cuts 124 and 126. In the illustrated embodiment, the dicing cuts are orthogonal to each other and therefore the relative flexibility of the larger solar cell junction is increased in orthogonal directions. Dicing can also provide passageways through the larger solar cell junction for connecting the front interconnects to the rear interconnect pads. This flexibility allows custom tailoring of single solar cell junction into subcircuits that will accommodate many shapes and curvatures exhibited by surfaces available for supporting the microarray on spacecraft without sacrificing operating efficiency. In the illustrated embodiment, each cell has an area of about 40 cm$^2$. The array includes 5 strips connected in parallel. Each strip has 18 cells.

Defining the solar cells in the microarray can also be done photolithographically during the preparation of the active areas. In photolithographic definition, a pattern is masked onto the large area. For materials not having a direct bandgap, dopants are diffused through uncovered windows in the mask into the solar cell base materials (e.g., Si or GaSb) to produce active n-type or p-type semiconductors to achieve the desired solar cell performance, if the dopants were not introduced during manufacture of the base material. Otherwise, the photoresist is used to define the mesas which will be the active transducers and the surrounding area is etched away. The photolithographic process is well known in the manufacture of semiconductor devices. With respect to solar cell manufacture, the photolithographic process (in particular, a double diffusion process for GaSb) is described in U.S. Pat. No. 5,217,539, which I incorporate by reference.

Figure 8:
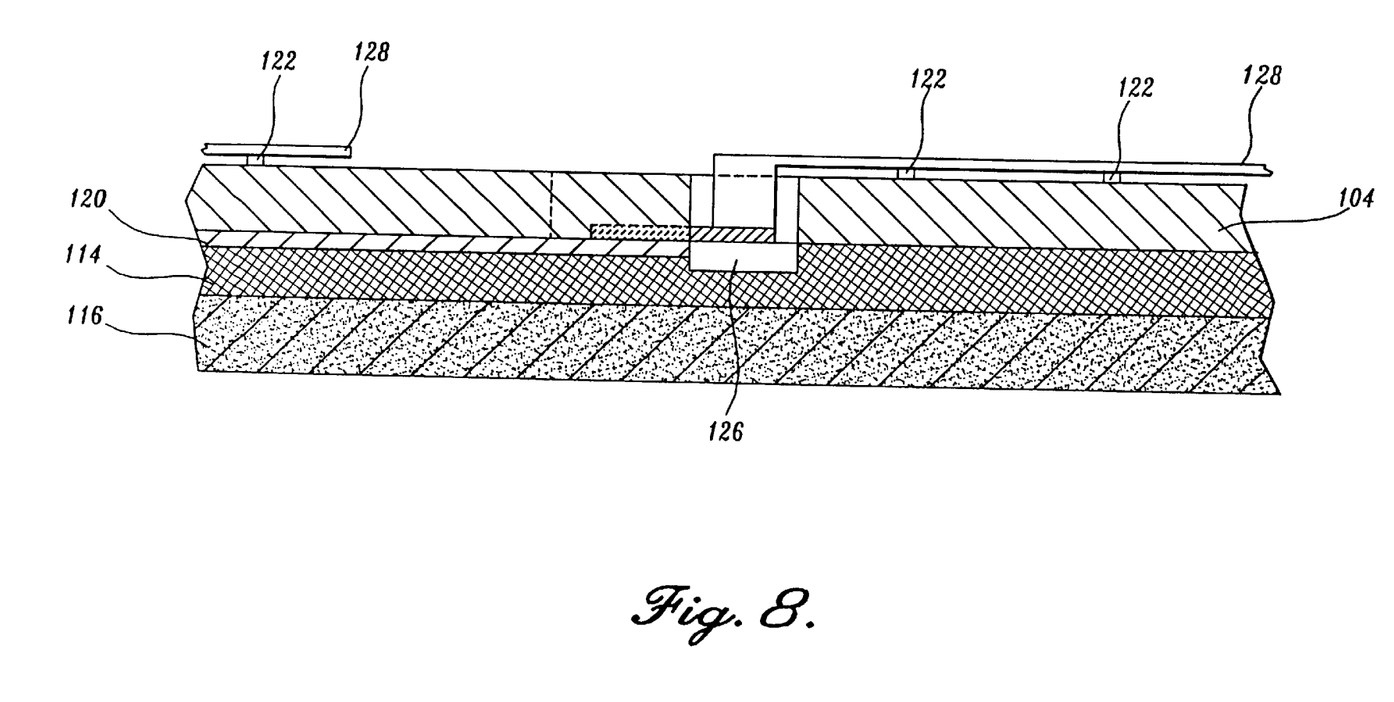
FIG. 8 is a section view taken generally along line 8—8 in FIG. 7.

Referring to FIGS. 7 and 8, once the larger solar cell junction has been divided into the smaller individual solar cells, the front interconnect 128 can be attached to the front of the solar cell junction and soldered to grid lines 122 of the smaller solar cells. The front interconnect pads 130 can then be secured to the rear interconnect 120 to provide electrical connection between the individual smaller solar cells.

When a diamond saw is used to perform the dicing of a larger solar cell, it is preferred to provide a pre-etching step to provide a pattern for the dicing. In a preferred embodiment, this pre-etching steps involves normal photolithographic line definition followed by etching of a groove in the cell surface. This etched groove ensures that the subsequent dicing will cut through a single material, with no chance of mixing junction materials and/or metal dust. Sawdust containing junction materials and/or metal has some risk of shorting the subcells, so photolithographical techniques to define the subcells are preferred.

The interconnects may be added by either the cell vendor or solar cell panel producer, which enables completion of the microarray from either the front (i.e., on a superstrate) or the back (with either a rear interconnect or a printed circuit substrate).

The small size of the microarrays formed in accordance with the present invention ensures that only the actual shaded areas are removed from power production. Using the Space Station Alpha as an example, if a single conventional cell in the contemplated, traditional arrays were shadowed, 28 square feet (nearly 400 watts) would be lost from power production compared with 0.07 square feet (1 watt) with a microarray.

For mounting on the curved surfaces of a satellite, (FIG. 9), the microarray subcircuits 900 subtend a small angle so that illumination is substantially uniform or is within acceptable limits on each subcircuit. The angle can be up to about 15° of arc. The microarray can conform with the surface but generally is planar across the subtended angle so that the exterior surface of the satellite becomes a series of facets.

Figure 9:
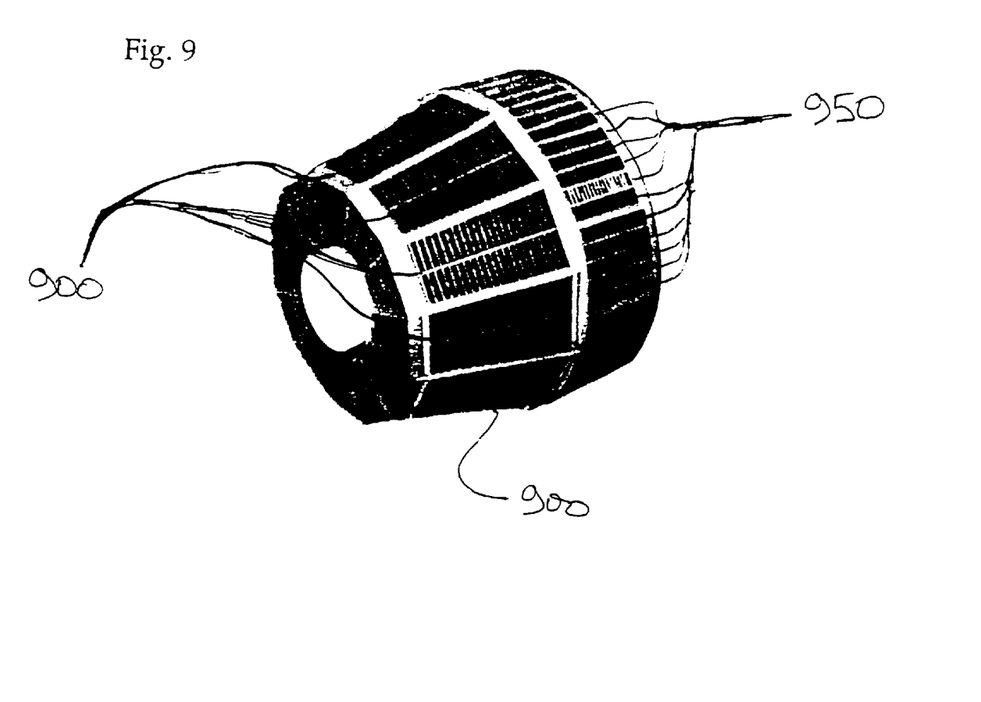
FIG. 9 is an environmental view of a microarray power circuits mounted on a satellite.
Figure 10:
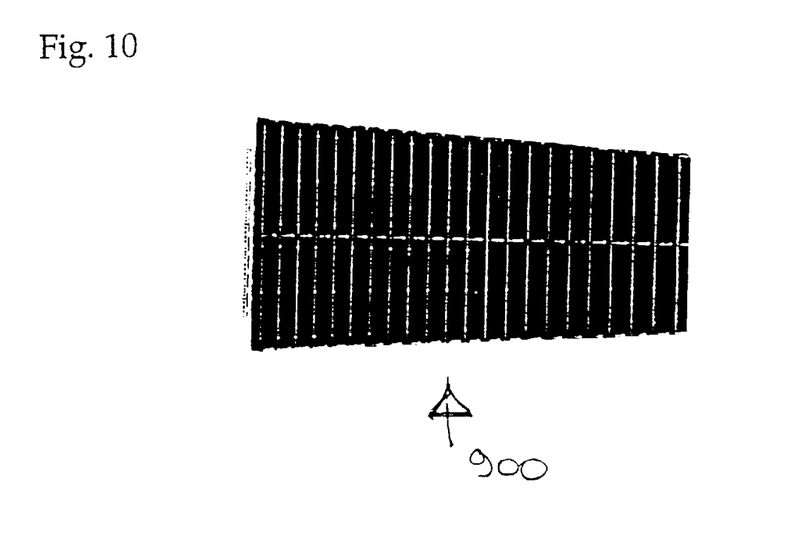
FIG. 10 is a subcircuit for the power circuits of FIG. 9.

Illumination and corresponding conversion efficiency of the solar cells follows the cosine law for degradation in performance. In addition, at high angles of incidence (such as 70° or more off-normal), most of the incident radiation reflects off the surface rather than being transmitted. As shown in FIG. 9, the subcircuits 900 constitute panels aligned with the longitudinal axis of rotation of the satellite. Subcircuits of two different designs and sizes are shown, subcircuits 900 on the body and subcircuits 950 on the rim. The subcircuits 900 have the design illustrated in FIG. 10, and are made from one or more 3 inch wafers subdivided into microarrays to provide the desired total voltage for the satellite system. The microarrays are connected in parallel so that whatever currents they produce are additive to provide a total satellite current. Using 3 inch wafers, the microarrays are substantially square and the subcircuit is rectangular. A typical subcircuit might be 3×9 or 3×12 inches, for example, by being a multiple of the microarrays.

The dimensions of the subcircuits 900 mean that each receives substantially equal illumination from top to bottom and from side to side. While the absolute illumination will differ with the true position of the subcircuit 900 relative to the sun, all the solar cells in a subcircuit will be receiving substantially equal illumination with this design. For subcircuits emerging from shadow or eclipsing into shadow, the illumination will be considerably less than that for subcircuits in the "noon" position (as opposed to "dawn" or "dusk"). The subcircuit and microarray design understands that illumination over the entire surface will differ because of the angle of incidence. The design provides microarrays and subcircuits having substantially equal illumination over their areas to provide maximum power for the entire coverage. No longer will cells in the "noon" position be connected in series with cells in the "dawn" or "dusk" position. No longer will the potential for a high conversion efficiency for the "noon" position be lost because of the series connection to poorly illuminated cells at the edges of shadow. With conventional designs, the entire array operates at the efficiency of the weakest cell. With microarrays and small subcircuits, we are able to isolate the areas of substantially equal illumination to achieve overall higher efficiency for the satellite power system.

At the rim of the satellite shown in FIG. 9, a second subcircuit design 950 is used. On the rim, the areas of equal illumination are too small to use microarrays or subcircuits based upon the 3 inch wafer design. Here, instead, we use 1 inch strip designs to optimize the total power collection. We can subdivide a 1 inch wafer into a microarray or can connect several 1 inch wafers in series in a rectilinear design to use slightly larger cells. As the cells become smaller the ratio between active cell area and inactive, interconnect area becomes larger and total power captured declines.

The microarrays can be used alone or in conjunction with conventional space power arrays since the microarrays are voltage matched for parallel connection with conventional arrays.

The microarrays can be used in a tandem cell arrangement whereby the top subcircuit is a microarray of cells responsive to the visible spectrum while transmissive to the infrared spectrum. The lower solar cell is responsive to the infrared radiation. The microarray can be mechanically connected to the underlying solar cell panel using conventional techniques.

Pre-drilled silicon cells and front and rear silver-plated molybdenum interconnects were used to demonstrate 7 cell microarrays. I attached a rear interconnect to the cell with a vapor phase solder, followed by adhesive bonding to a substrate. Then the cell was cut into equal area segments. Dicing with a diamond saw also cut through the rear interconnects but not the substrate and exposed the interconnect access holes. Then the front interconnect were attached to both the front cell grids and rear interconnects with a second vapor phase solder process.

Further development of the microarray concept enlarged the initial junction size to 2.5 inches×2.5 inches and added features to enable it to be mounted on a curved surface. This version (FIG. 7) included 5 cells in parallel and 18 cells in series and generated 12.86% efficiency at 8.5 volts under air mass zero (AM0) illumination. The 12.86% value is based on active cell area which is 88% of the microarray area. Improvements to increase the active area to 95% and cell performance to 14% will result in microarray efficiency of 13.3%. The microarray demonstrated predictable performance throughout a series of tests: thermal cycling, forward bias current (dark), and angle of incidence tests, and successfully passed vibration, shock, and thermal cycling tests without mechanical or electrical degradation. Some microarrays are made from multiple wafers of 100 mm diameter which are performance matched prior to being aligned during the microarray assembly process.

A satellite's electrical power system includes a solar array assembly, power control electronics, batteries, and wiring. The solar array assembly includes a solar panel assembly, support structures, a temperature sensor, and appropriate wiring. The solar panel assembly, typically, has a plurality of microarrays.

Microarrays provide higher array efficiency than conventional designs and allow power collection on surfaces unusable until now.

While I illustrated and described a preferred embodiment, those of ordinary skill will appreciate that various changes can be made to the preferred embodiment without departing from the spirit and scope of the invention.

I claim:

1. A microarray for generating electricity from incident solar energy, comprising:
   (a) a plurality of solar cells responsive to the incident solar energy to generate electricity, each cell having substantially equal area to produce a characteristic voltage at a matching current;
   (b) gaps to separate the cells;
   (c) redundant, electrically conductive interconnects spanning the gap between each pair of cells for electrically connecting the cells in series to obtain an output voltage at the matching current; and
   (c) a flexible carrier adhered to the cells for holding the cells and interconnects in a desired array configuration adapted for mounting directly to the exterior surface of a satellite, the array having a higher specific voltage than conventional solar cell arrays by using smaller cells.

2. A method for collecting solar energy at a selected voltage and current on a satellite using a solar cell microarray that includes a plurality of solar cells having substantially equal surface areas, comprising steps of:
   (a) determining the total area of a surface on the exterior of the satellite having substantially equal illumination and being available to support the solar cell microarray for collecting solar energy;
   (b) determining the output voltage for the microarray;
   (c) dividing the output voltage by the voltage contribution from each individual solar cell when the cells are substantially equally illuminated in the microarray to determine a number of solar cells required;
   (d) determining the surface area for each individual solar cell that will make up the microarray by dividing the total area of step (b) by the number of solar cells of step (c) while adjusting for a packing factor for the microarray necessary to interconnect the solar cells in series;
   (e) partitioning a phototransducer of the size of the total area into the number of cells, each cell having an equal area, each cell being separated from adjacent cells by unfilled channels cut through the phototransducer;
   (f) interconnecting the cells in series to provide the microarray;
   (g) applying the microarray to the surface; and
   (h) illuminating the microarray so that the equal illumination on the surface having the microarray allows each cell to generate a matched current with the other cells in the microarray and so that the voltage of the microarray is the sum of the voltage produced in each cell.

3. A microarry of solar cells, comprising:
   (a) a plurality of electronically interconnected, nonrectangular subcells formed by dividing a larger solar cell junction into the subcells, the subcells having surface areas that are substantially equal to each other,
   (b) a plurality of channels cut through the junction and separating the subcells from each other, the channels being unfilled and allowing the microarray to conform to nonplanar surfaces and
   (c) a flexible substrate to which the cells are adhered.

4. A satellite having solar cells covering its exterior surface, the solar cells being interconnected in series into a plurality of subcircuits, each subcircuit having a desired satellite voltage, the subcircuits being interconnected in parallel to combine currents generated in each subcircuit into a total satellite current, the subcircuits being planar, and the satellite having subcircuits of at least two different geometries to provide maximum power generation for the satellite by assuring that the cells in each subcircuit experience substantially equal illumination and, thereby, generate power with substantially the same efficiency.

5. A method for making a solar power array from a single wafer of a photovoltaic transducer material, comprising the step of:
   (a) applying a rear contact to the transducer material;
   (b) dicing the transducer material to define diced regions where material has been removed and a plurality of individual, photovoltaic cells of substantially equal area separated by the diced regions, the cells providing a predetermined, combined, total voltage for the array, the voltage being the number of cells multiplied by the inherent voltage that each cell in the material produces when substantially equally illuminated; and
   (c) applying a front contact with interconnects for the cells that extend through the diced regions to interconnect the cells serially into a complete circuit.

6. The array produced by the method of claim 5.

7. A method for making a microarray, comprising the steps of:
   from a single phototransducer wafer capable of converting incident electromagnetic radiation in at least one wavelength band to electrical power,
   (a) applying a rear contact to the wafer;
   (b) dicing the phototransducer to define diced regions where the phototransducer has been removed and electrically isolated individual cells having substantially equal areas such that the microarray voltage from substantially equally illuminated cells will be given by:
      (number of serially interconnected cells)×(inherent voltage of the phototransducer) at a matching current produced in each cell; and
   (c) applying a front contact with integral interconnects through diced regions in the wafer to complete series connection between the cells.

* * * * *